(12) United States Patent
Lin et al.

(10) Patent No.: US 11,984,384 B2
(45) Date of Patent: May 14, 2024

(54) POWER ROUTING FOR 2.5D OR 3D INTEGRATED CIRCUITS INCLUDING A BURIED POWER RAIL AND INTERPOSER WITH POWER DELIVERY NETWORK

(71) Applicant: Synopsys, Inc., Mountain View, CA (US)

(72) Inventors: Xi-Wei Lin, Fremont, CA (US); Victor Moroz, Saratoga, CA (US)

(73) Assignee: Synopsys, Inc., Sunnyvale, CA (US)

( * ) Notice: Subject to any disclaimer, the term of this patent is extended or adjusted under 35 U.S.C. 154(b) by 141 days.

(21) Appl. No.: 17/471,060

(22) Filed: Sep. 9, 2021

(65) Prior Publication Data
US 2023/0074159 A1 Mar. 9, 2023

(51) Int. Cl.
H01L 23/48 (2006.01)
H01L 23/00 (2006.01)
H01L 23/538 (2006.01)

(52) U.S. Cl.
CPC ........ H01L 23/481 (2013.01); H01L 23/5383 (2013.01); H01L 24/19 (2013.01);
(Continued)

(58) Field of Classification Search
CPC . H01L 23/481; H01L 23/5286; H01L 23/535; H01L 23/5383; H01L 21/76898; H01L 2924/1431; H01L 2924/1434; H01L 25/0655; H01L 25/0652; H01L 24/08; H01L 24/14; H01L 24/16; H01L 24/19; H01L 24/24; H01L 24/73; H01L 25/18;
(Continued)

(56) References Cited

U.S. PATENT DOCUMENTS 8,758,961 B1 * 6/2014 Plofsky ................. H01L 21/283
430/394
9,870,979 B2 * 1/2018 Batra ..................... H01L 25/50
(Continued)

FOREIGN PATENT DOCUMENTS

EP 3742487 A1 11/2020

OTHER PUBLICATIONS

Hossen, M. O. et al. "Power Delivery Network (PDN) Modeling for Backside-PDN Configurations with Buried Power Rails and µTSVs." IEEE Transactions on Electron Devices, vol. 67, No. 1, Jan. 2020, pp. 11-17.
(Continued)

Primary Examiner — Khiem D Nguyen
(74) Attorney, Agent, or Firm — Fenwick & West LLP

(57) ABSTRACT

Embodiments relate to an electronic circuit implemented using a first integrated circuit die, a second integrated circuit die, and an interposer connecting the first integrated circuit die to the second integrated circuit die. The first integrated circuit die implements a first electronic circuit. The first integrated circuit die includes a first set of contacts on a bottom surface, a buried power rail (BPR), and a plurality of through-silicon vias (TSV) for connecting the BPR to the first set of contacts. The interposer includes a second set of contacts and a power delivery network (PDN). Each contact of the second set of contact corresponds to a contact of the first set of contacts of the first integrated circuit die. The PDN is configured to route a power supply voltage to the second set of contacts.

13 Claims, 14 Drawing Sheets

(52) U.S. Cl.
CPC ..... *H01L 24/24* (2013.01); *H01L 2224/24137* (2013.01); *H01L 2924/1431* (2013.01); *H01L 2924/1434* (2013.01)

(58) Field of Classification Search
CPC ... H01L 2224/0401; H01L 2224/17181; H01L 2224/08225; H01L 2224/06181; H01L 2224/24137; H01L 23/5386; H01L 24/13; H01L 24/81
USPC ........................................................ 257/668
See application file for complete search history.

(56) References Cited

U.S. PATENT DOCUMENTS

| | | | | |
|---|---|---|---|---|
| 10,510,774 | B2* | 12/2019 | Debacker | H01L 27/0207 |
| 11,195,797 | B2* | 12/2021 | Vadi | H01L 27/0207 |
| 2017/0148869 | A1* | 5/2017 | Detalle | H01L 28/40 |
| 2018/0145030 | A1* | 5/2018 | Beyne | H01L 23/5283 |
| 2020/0203276 | A1* | 6/2020 | Hiblot | H01L 21/743 |
| 2020/0312742 | A1* | 10/2020 | Lofgreen | H10N 10/82 |
| 2020/0373242 | A1* | 11/2020 | Hiblot | H01L 23/5384 |
| 2020/0373331 | A1* | 11/2020 | Kim | H01L 21/76898 |
| 2021/0143127 | A1* | 5/2021 | Jain | H01L 23/481 |
| 2022/0084955 | A1* | 3/2022 | Liu | H01L 23/552 |
| 2022/0165721 | A1* | 5/2022 | Lee | H01L 25/50 |

OTHER PUBLICATIONS

Lin, H. et al. "System Optimization: High-Frequency Buck Converter with 3-D In-Package Air-Core Inductor." IEEE Transactions on Components, Packaging and Manufacturing Technology, vol. 12, No. 3, Mar. 2022, pp. 401-409.
PCT International Search Report and Written Opinion, PCT Application No. PCT/US2021/050986, dated Jun. 13, 2022, 15 pages.

* cited by examiner

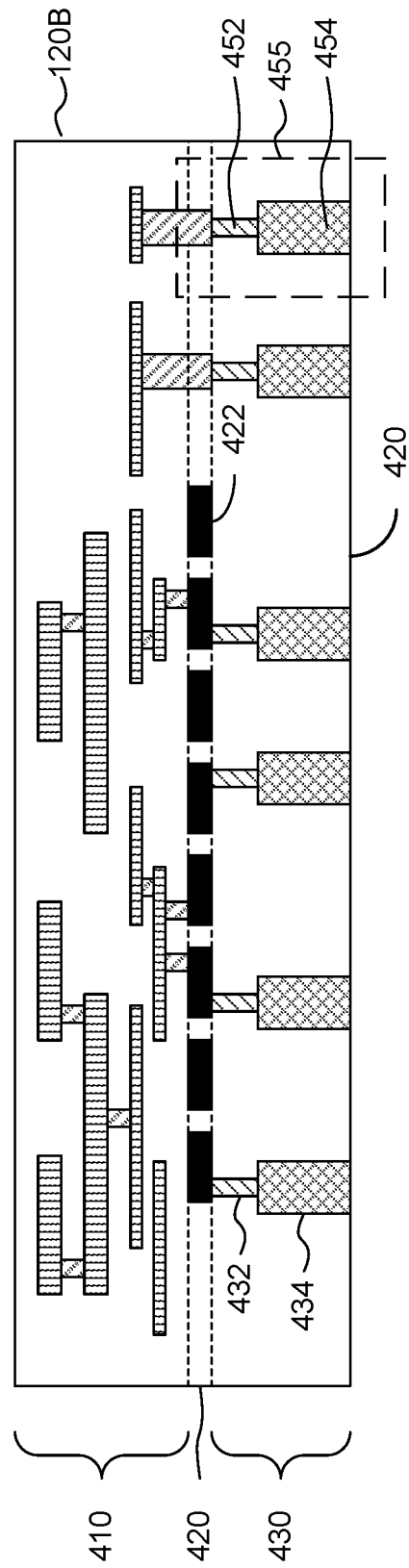
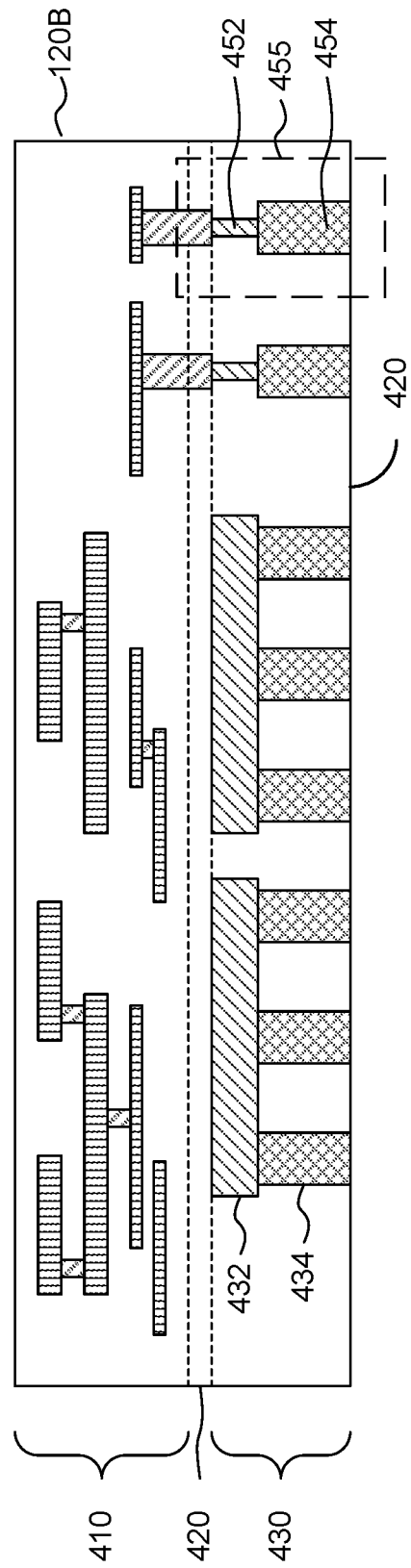
FIG. 4C
FIG. 4D

US 11,984,384 B2

POWER ROUTING FOR 2.5D OR 3D INTEGRATED CIRCUITS INCLUDING A BURIED POWER RAIL AND INTERPOSER WITH POWER DELIVERY NETWORK

BACKGROUND OF THE DISCLOSURE

1. Field of the Disclosure

The present disclosure relates to integrated circuit design and more specifically to interconnecting multiple semiconductor dice implementing integrated circuits.

2. Description of the Related Art

Advances in three dimensional (3D) integrated circuit (IC) packaging technology has enabled large scale heterogeneous integration of diverse functional chiplets or packages, such as logic dice and memory modules on a 2.5D interposer. For example, a package may include of a silicon interposer and a system-on-chip (SOC) logic die placed facedown, alongside of high bandwidth memory (HBM) modules, bonded together by micro solder bumps (µbumps) for interconnection.

The SOC includes a power delivery network (PDN), receiving power supply through the µbumps, and routing the power supply to a set of power rails. However, as the technology feature size scales down, it becomes increasingly difficult to deliver power from the frontside of the SOC due to voltage drop and routing constraints of the conductors used for routing power throughout the SOC.

SUMMARY

Embodiments relate to an electronic circuit implemented using a first integrated circuit die, a second integrated circuit die, and an interposer connecting the first integrated circuit die to the second integrated circuit die. The first integrated circuit die implements a first electronic circuit. The first integrated circuit die includes a first set of contacts on a bottom surface, a buried power rail (BPR), and a plurality of through-silicon vias (TSV) for connecting the BPR to the first set of contacts. The interposer includes a second set of contacts and a power delivery network (PDN). Each contact of the second set of contact corresponds to a contact of the first set of contacts of the first integrated circuit die. The PDN is configured to route a power supply voltage to the second set of contacts. In some embodiments, the first integrated circuit die is bonded to the interposer. For example, the bottom surface of the integrated circuit die is bonded to the top surface of the interposer. Moreover, in some embodiments, the interposer is fabricated using a larger technology node than the first integrated circuit die.

BRIEF DESCRIPTION OF THE DRAWINGS

The teachings of the embodiments can be readily understood by considering the following detailed description in conjunction with the accompanying drawings.

FIG. 4C illustrates a cross sectional view of the first integrated circuit die configured to be connected to an interposer having an iPDN, according to one or more embodiments.

FIG. 4D illustrates a cross sectional view of the first integrated circuit die 120B configured to be connected to an interposer having an iPDN across a second direction, according to one or more embodiments.

DETAILED DESCRIPTION OF EMBODIMENTS

Figure 1A:
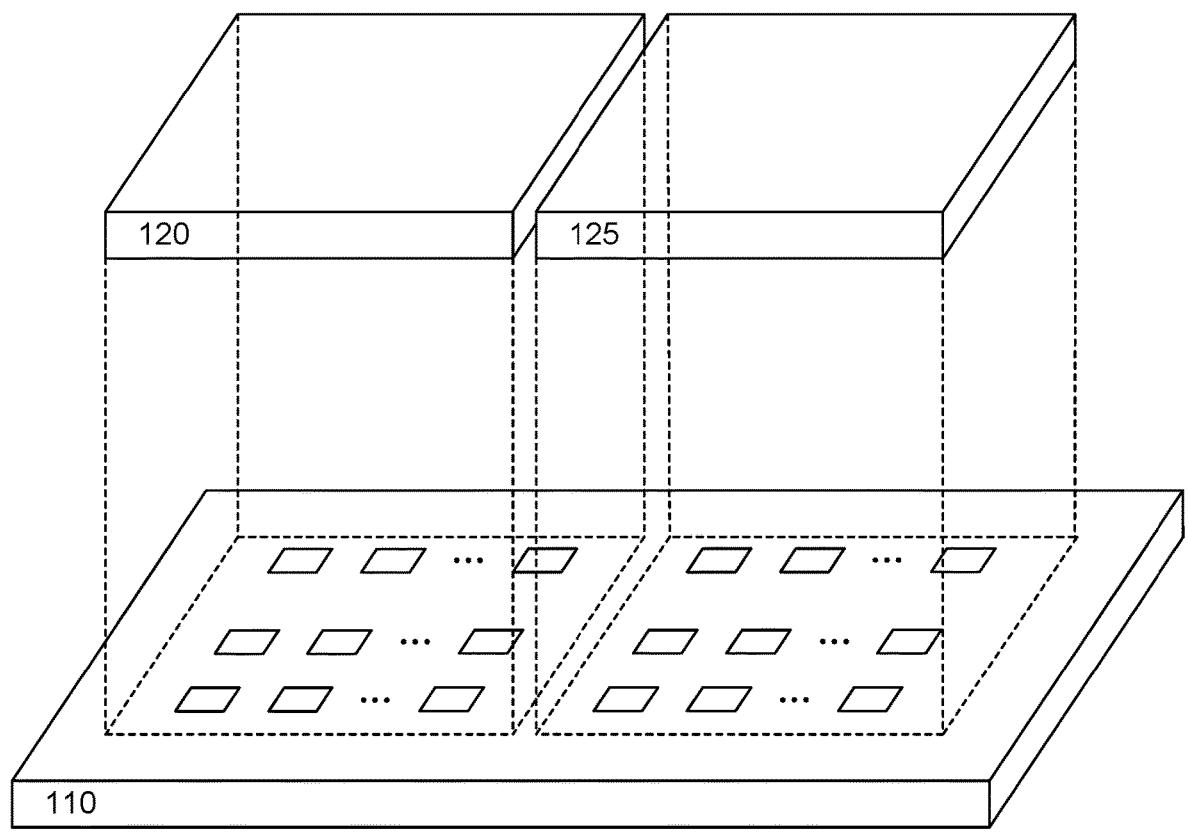
FIG. 1A illustrates an exploded elevation view of multiple integrated circuit dice aligned to an interposer, according to one or more embodiments.

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Aspects of the present disclosure relate to power and signal routing for 2.5D or 3D integrated circuits. In particular, to implementing a power delivery network in an interposer connected to an integrated circuit die to distribute a power supply voltage to multiple contacts of the integrated circuit die, each corresponding to a through silicon via connected to buried power rails.

Typically, distribution of power supplies is implemented using interconnects in the metal layers located on the front side of the integrated circuit die. The power delivery network is used to connect each of the power rails to their respective supply voltages. For example, an integrated circuit die may have a first set of power rails for supplying a first supply voltage (e.g., Vdd), and a second set of power rails for supplying a second supply voltage. The power delivery network includes interconnects for connecting each power rail in the first set of power rails to the first supply voltage and for connecting each power rail in the second set of power rails to the second supply voltage. Moreover, the power delivery network includes interconnects for providing the corresponding supply voltage to multiple locations within the same power rail to reduce the effect of a voltage drop due to the resistivity of the power rails.

However, as feature size of the integrated circuits gets smaller, the metal interconnect resistance increases, which may cause an increase in power rail voltage drop, if the same current flows through the metal interconnects. In order to mitigate the voltage drop increase, more number of metal interconnects are used for the power delivery network, leading to crowded metal layers located on the front side of the integrated circuit die. As such, it becomes increasingly difficult to design a power delivery network that shares the same metal layers with the interconnects used for connecting the transistors with each other to form the various circuits implemented in the integrated circuit die.

To alleviate this problem, the power delivery network for the integrated circuit die is implemented either on the back side of the integrated circuit die, or is implemented in an interposer that is configured to be connected to the integrated circuit die through the back side of the integrated circuit die. The power delivery network that is formed on the back side of the integrated circuit die or in an interposer is brought to the front side using through-silicon vias that are connected to buried metal interconnects. In some embodiments, the power rails are implemented as buried power rails by running buried metal interconnects along isolation regions at a level below active components (i.e., transistors) within the layout of the integrated circuit die.

By moving the power delivery network away from the front side of the integrated circuit die, the design of both the power delivery network and the interconnects for connecting the transistors to each other can be simplified. Moreover, by moving the power delivery network from the integrated circuit die to the interposer, the cost and yield of manufacturing the integrated circuit die can be improved.

Configuration Overview

Figure 1B:
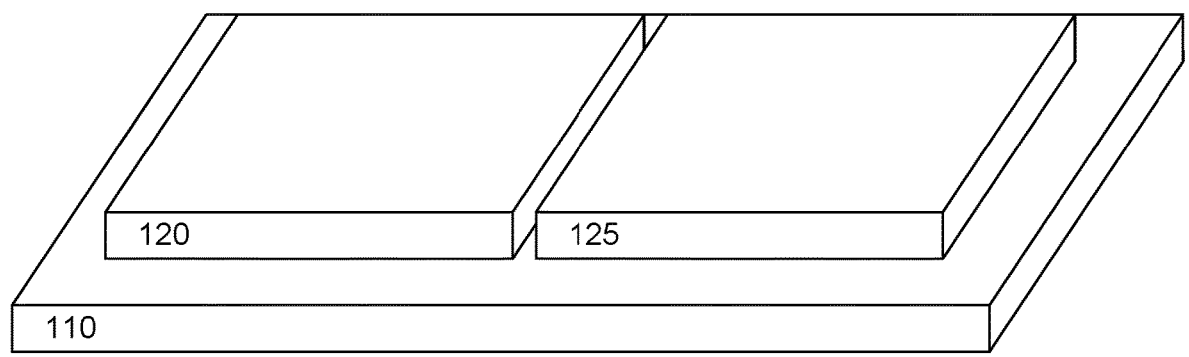
FIG. 1B illustrates an elevation view of a system implemented using multiple integrated circuit dice connected to an interposer, according to one or more embodiments.

FIG. 1A illustrates an exploded elevation view of multiple integrated circuit dice 120 aligned to an interposer 110, according to one or more embodiments. FIG. 1B illustrates an elevation view of a system implemented using multiple integrated circuit dice (including a first integrated circuit die 120 and a second integrated circuit die 125) connected to an interposer 110, according to one or more embodiments. In the example of FIGS. 1A-B the system is implemented using two integrated circuit dice 120, 125 and an interposer 110. However, other embodiments may use a different number of integrated circuit dice and a different number of interposers.

In some embodiments, the first integrated circuit die 120 is a logic circuit, and the second integrated circuit die 125 is a high bandwidth memory (HBM). Each of the integrated circuit dice 120 and 125 includes a set of contacts for connecting the integrated circuit implemented in the die to the interposer 110. In some embodiments, the contacts of the integrated circuit dice 120 are micro solder balls or micro solder. Alternatively, the contacts of the integrated circuit dice 120, 125 are pads. Moreover, although the contacts in FIG. 1A are illustrated as square pads, the contacts may have any other geometric shape (such as hexagonal, circular, or elliptical).

The interposer connects the first integrated circuit die 120 to the second integrated circuit die 125. The interposer has a first set of contacts corresponding to the set of contacts of the first integrated circuit die 120, and a second set of contacts corresponding to the set of contacts of the second integrated circuit die 125. The interposer 110 additionally includes a set of interconnects for connecting one contact to another contact. For example, the interposer 110 includes a first set of interconnects for connecting contacts corresponding to the first integrated circuit die 120 to contacts corresponding to the second integrated circuit die 125.

The interposer additionally connects the first integrated circuit die 120 or the second integrated circuit die 125 to an external circuit (such as a package substrate that is then placed on a printed circuit board or PCB). The interposer may include a third set of contacts to connect to the external circuit. Additionally, the interposer 110 may include interconnects for connecting contacts corresponding to the first integrated circuit die 120 or contacts corresponding to the second integrated circuit die 125 to contacts corresponding to the external circuit (contacts of the third set of contacts).

In some embodiments, the interposer is a silicon interposer. The interposer may be fabricated using a larger fabrication process or technology node than the first integrated circuit die 120 and the second integrated circuit die 125. In some embodiments, the interposer 110 only includes wires for connecting the contacts to one another. In other embodiments, the interposer 110 also includes passive components (such as resistors or capacitors) or active components (such as buffers, registers, or amplifiers).

2.5D or 3D IC Architecture Having a Back-Side Power Deliver Network

Figure 2A:
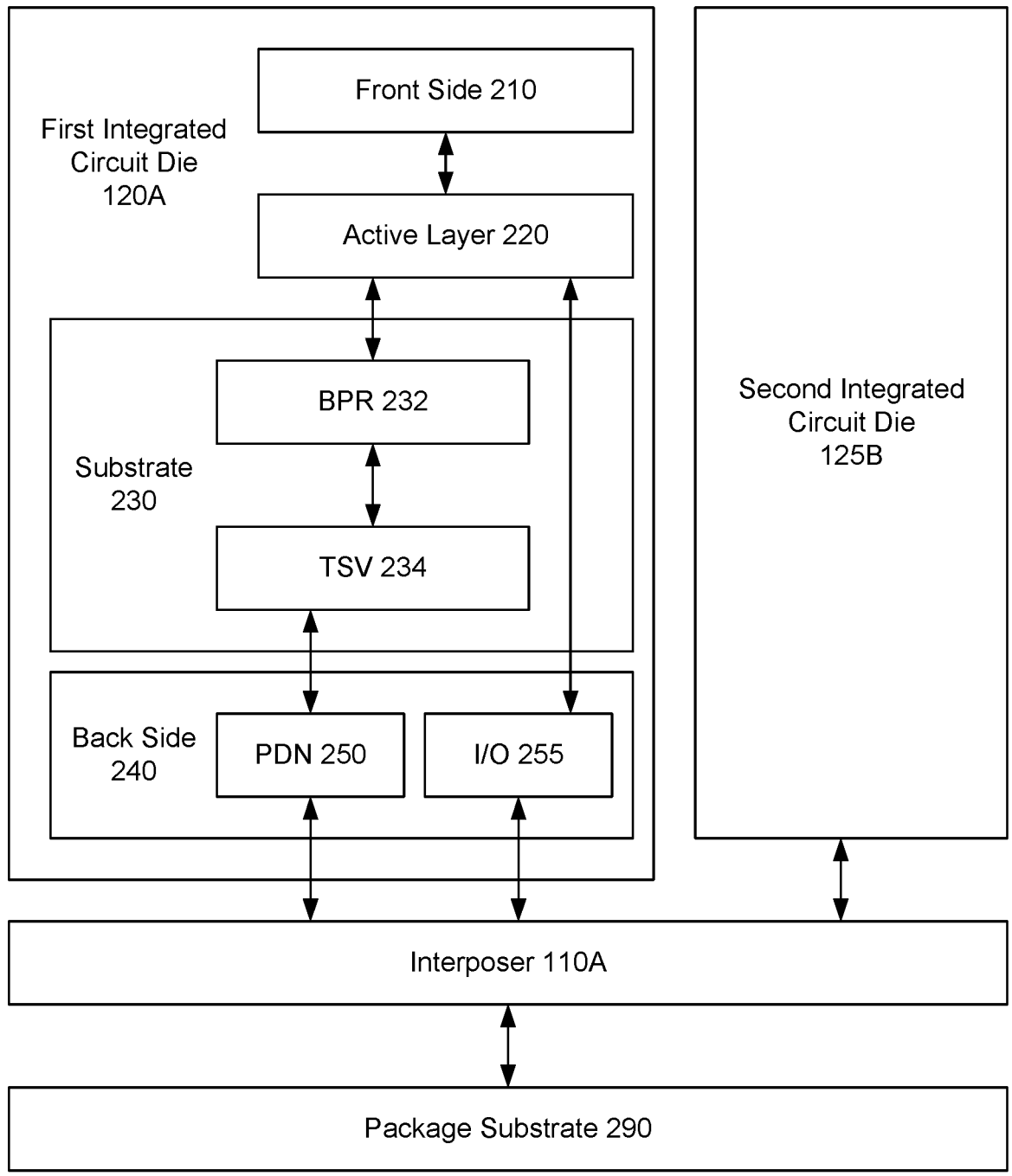
FIG. 2A is a block diagram illustrating an interposer architecture having multiple integrated circuit dice (e.g., a first integrated circuit die and a second integrated circuit die) aligned to an interposer, according to one or more embodiments.
Figure 2B:
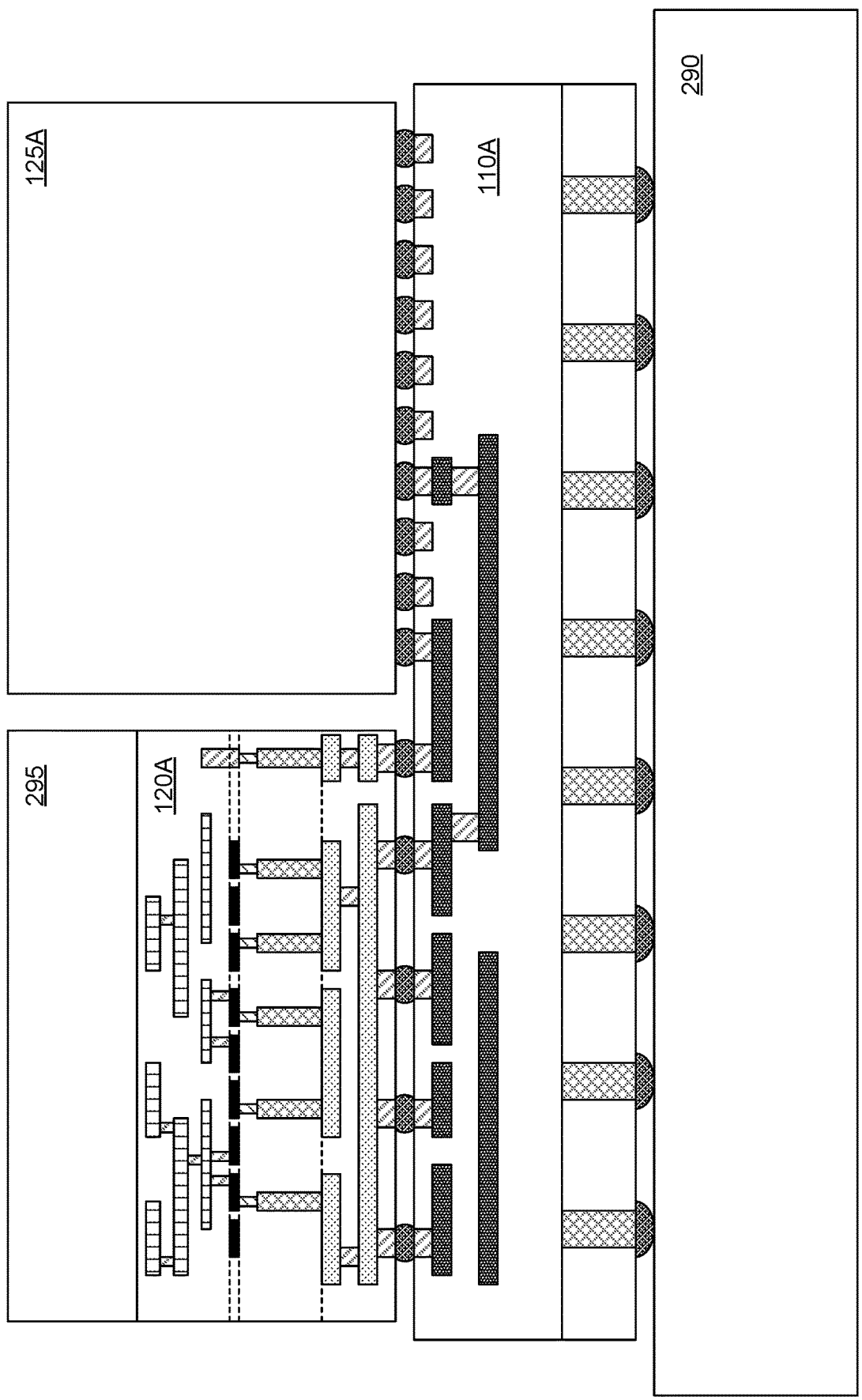
FIG. 2B illustrates a cross sectional view of multiple integrated circuit dice aligned to an interposer, according to one or more embodiments.

FIG. 2A is a block diagram illustrating an interposer architecture having multiple integrated circuit dice (e.g., a first integrated circuit die 120 and a second integrated circuit die 125) aligned to an interposer 110, according to one or more embodiments. FIG. 2B illustrates a cross sectional view of multiple integrated circuit dice aligned to an interposer 110, according to one or more embodiments. In the example of FIGS. 2A-2B, the first integrated circuit die 120A and the second integrated circuit die 125A are connected to each other through the interposer 110A. Moreover, the first integrated circuit die 120A and second integrated circuit die 125B are connected to the package substrate 290 through the interposer 110A.

In some embodiments, a lid 295 placed on top of the first integrated circuit die 120A. The lid 295 may be configured to increase the height of the first integrated circuit die 120A to be substantially equal to the height of the second integrated circuit die 125A. In some embodiment lid 295 is configured to enable the first integrated circuit die to be thermally coupled to a heat spreader (such as a heat sink or an integrated heat spreader). In this embodiment, the lid 295 is attached to the top of the first integrated circuit die 120A through a thermal interface material (TIM).

The first integrated circuit die 120A includes contacts that are aligned to contacts of the interposer 110A. The contacts of the first integrated circuit die 120A are then electrically connected to the contacts of the interposer 110A to connect the electrical components of the first integrated circuit die 120A to the electrical components of the interposer 110A. In some embodiments, the first integrated circuit die 120A is electrically connected to the interposer 110A using micro solder balls or micro solder bumps. The micro solder balls or micro solder bumps are melted to cause the solder to reflow and be attached to both the contacts of the first integrated circuit die 120A and the contacts of the interposer die 110A. Moreover, in addition to providing electrical connection, the micro solder balls or micro solder bumps mechanically attach the first integrated circuit die 120A to the interposer die 110A. Similarly, the second integrated circuit die 125A includes contacts that are aligned and electrically connected to contacts of interposer 110A.

Figure 2C:
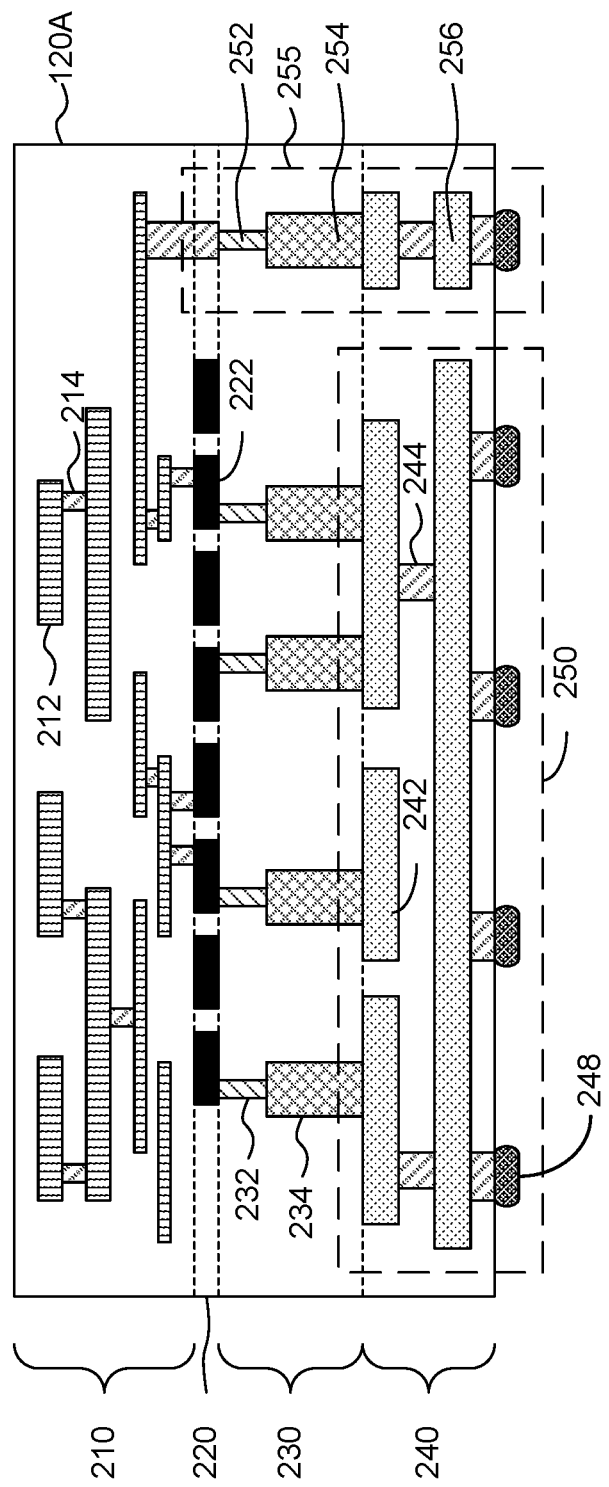
FIG. 2C illustrates a cross sectional view of the first integrated circuit die across a first direction, according to one or more embodiments.
Figure 2D:
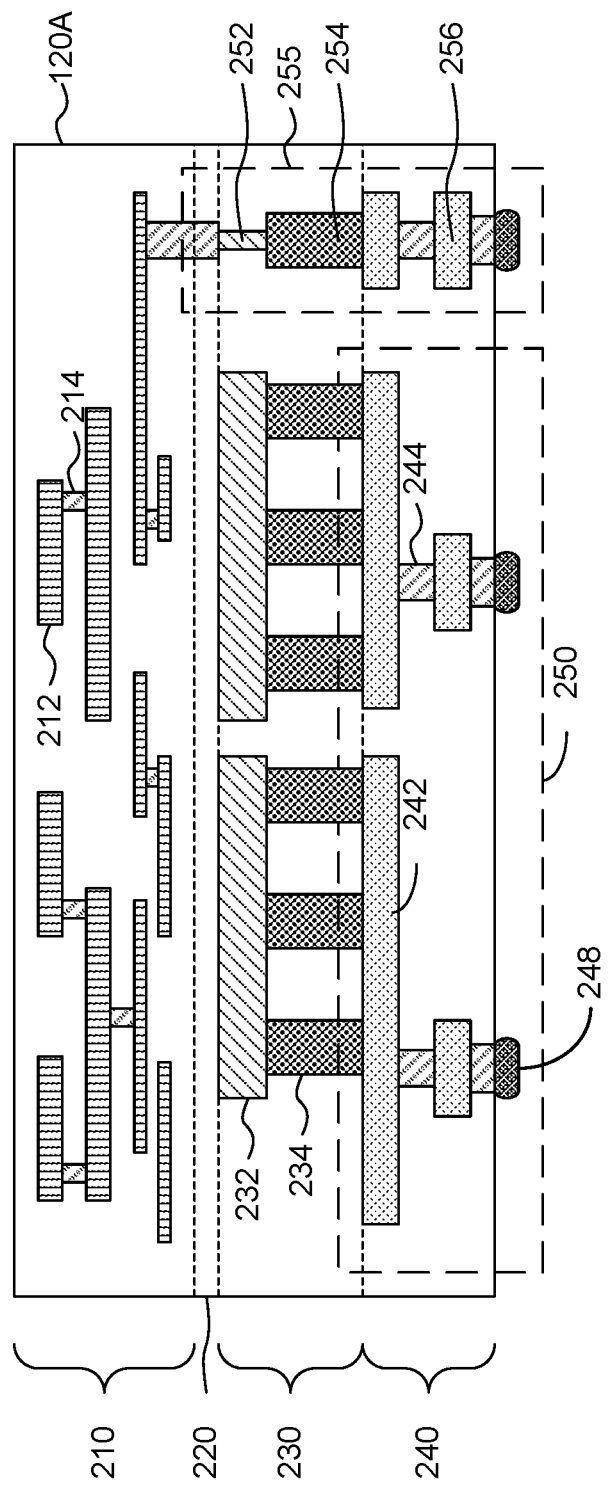
FIG. 2D illustrates a cross sectional view of the first integrated circuit die across a second direction, according to one or more embodiments.

FIG. 2C illustrates a cross sectional view of the first integrated circuit die 120A across a first direction, according to one or more embodiments. FIG. 2D illustrates a cross sectional view of the first integrated circuit die across a second direction, according to one or more embodiments. The first integrated circuit die 120A includes active layer 220 where a set of active components 222 (such as transistors) are implemented. The active layer 220 is formed over the substrate 230. In some embodiments, the transistors 222 are formed by processing the surface of the substrate 230 (e.g., by etching the surface of the substrate, by depositing or growing layers on top of the surface of the substrate, etc.).

In some embodiments, the transistors 222 are fin field-effect transistors (FinFET). The FinFETs are fabricated by forming semiconductor fins on the surface top of the substrate 230. For example, the fins are formed by patterning the top surface of the substrate 230. In another example, the fins are formed by depositing or growing the fins over top surface of the substrate 230. In some embodiments, the transistors are separated from each other by isolation regions (e.g., by shallow trench isolation (STI) regions).

Over the active layer 220, on the front side 210 of the first integrated circuit die 120A, a set of interconnects are formed. The interconnects connect the active components in the active layer 220 to each other forming one or more circuits. In some embodiments, the interconnects are formed by depositing or growing layers over the active area 220 and patterning the deposited or grown layers. The set of interconnects include a set of metal layers 212 and a set of vias 214. The set of vias 214 connect a first metal interconnect on a first metal layer to a second metal interconnect on a second metal layer above or below the first metal layer.

The first integrated circuit 120A further includes a substrate 230 having a set buried power rails (BPR) 232 and a set of through-silicon vias (TSV) 234. The BPRs 232 are configured to provide a supply voltage or a reference voltage to the transistors 222 in the active layer 220. The BPR 232 may be formed to run underneath the active layer 220. In some embodiments, the BPR 232 is formed within the isolation regions of the first integrated circuit 120A (e.g., embedded within the shallow trench isolation (STI) regions of the first integrated circuit). In some embodiments, the BPR 232 is formed by etching trenches in the substrate (e.g., within the STI) and filling the trench with a conductive material (such as a metal). Moreover, the BPRs are connected to the transistors by depositing a conductive layer over the substrate after the BPR has been formed and patterning the conductive layer.

In some embodiments, the substrate 230 includes multiple BPRs 232. For instance, the substrate includes a first BPR for providing a first supply voltage (e.g., VDD) and a second BPR for providing a second supply voltage (e.g., VSS or GND). Moreover, in some embodiments, the substrate 230 includes a first BPR for providing the first supply voltage to a first subset of transistors, and a third BPR for providing the first supply voltage to a second subset of transistors.

The TSVs 234 are configured to connect the BPR 232 to the power delivery network (PDN) 240. In some embodiments, the TSV 234 are nanometer-TSV (nTSV). For instance, the nTSVs may have a width between 30 nm and 100 nm and a height between 50 nm and 200 nm. The TSVs are embedded within the substrate of the first integrated circuit die 120A between a first side of the substrate 230 (e.g., bottom side) and a second side of the substrate 230 opposite to the first side (e.g., a top side). In some embodiments, the TSVs 234 allow electrical signals to be routed between the back side 240 of the first integrated circuit die 120A and the front side 210 of the integrated circuit die 120A.

In some embodiments, the geometry and the pitch of the TSV 234 are constrained by the fabrication technology node used for fabricating the first integrated circuit die 120A. In some embodiments, the TSVs 234 are formed by etching the substrate 230 through the back side until portions of the BPRs 232 are exposed and depositing a conductive material.

In some embodiments, one BPR 232 is connected to multiple TSVs 234. Specifically, the TSVs 234 enable the BPR 232 to be connected to the PDN 240 at multiple locations, reducing the effect of voltage drop across the BPR 232 due to the resistivity of the BPR conductor used for fabricating the BPR 232. For example, a TSV 234 may be added to the layout of the first integrated circuit die 120A at least every set length of a BPR 232. In some embodiments, the frequency at which a TSV 234 is added to the layout of the first integrated circuit die 120A is constrained by a minimum pitch size for the TSVs corresponding to the fabrication technology node used for fabricating the first integrated circuit die 120A.

In the back side 240 of the integrated circuit die 120A, under the substrate 230, the back-side power delivery network (PDN) 250 is formed. In some embodiments, a set of input-output (I/O) nodes 255 are also formed in the back side 240 of the integrated circuit die 120A. In some embodiments, the PDN 250 is formed by depositing or growing layers over the bottom surface of the substrate 230 and patterning the deposited or grown layers. The PDN 250 includes a set of back-side metal layers 242 and a set of back-side vias 244. The set of back-side vias 244 connect a first metal interconnect on a first back-side metal layer to a second metal interconnect on a second back-side metal layer above or below the first back-side metal layer. Moreover, the back-side 240 includes insulating layers between the metal layers 242 to isolate a metal layer from metal layers above or below the metal layer.

In some embodiments, the PDN 250 is connected to the interposer 110 and to the TSV 234. The PDN 250 receives one or more power supply voltages and reference voltages and routes the power supply voltages and the reference voltages to the TSVs 234. Moreover, the TSVs 234 further route the one or more power supply voltages and the reference voltages to the BPRs 232. In some embodiments, the PDN 250 connects multiple TSVs to each other to provide a supply voltage to multiple BPRs 232 or to multiple locations within the same BPR 232. For example, the PDN 250 connects TSVs corresponding to BPRs for providing a first supply voltage (e.g., Vdd) to transistors 222 to each other, and connects TSVs corresponding to BPRs for providing a second supply voltage (e.g., Vss or ground) to transistors 222 to each other.

The I/O nodes 255 are configured to be connected to the interposer 110 to receive one or more input signals from the second integrated circuit die 125A or the package substrate 290, and to send one or more output signals to the second integrated circuit die 125A or the package substrate 290. In some embodiments, the I/O nodes 255 are coupled to the interconnects in the front side 210 of the first integrated circuit die 120A. In some embodiments, each I/O node 255 includes a buried conductor 252 and a TSV 254 formed within the substrate 230 of the first integrated circuit die 120A, and a set of back-side metal interconnects 256 formed in the back side 240 of the first integrated circuit die 120A. In some embodiments, the buried conductor 252 is formed together with the BPR 232. Moreover, the TSV 254 of the I/O node 255 is formed together with the TSVs 234 connected to the PDN 250.

The PDN 250 and the I/O nodes 255 are connected to contacts 248 at the bottom surface of the first integrated circuit die 120A. In some embodiments, the contacts 248 are micro solder balls or micro solder bumps. The contacts 248 of the first integrated circuit are configured to align with and connect to contacts of the interposer 110A.

Figure 2E:
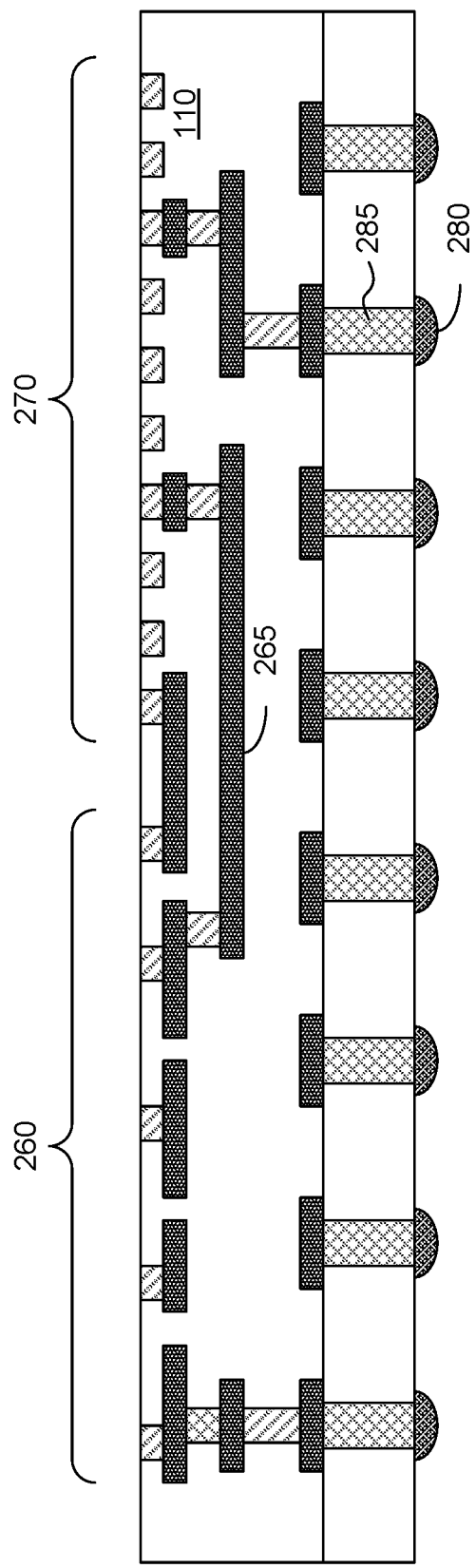
FIG. 2E illustrates a cross sectional view of the interposer, according to one or more embodiments.

FIG. 2E illustrates a cross sectional view of the interposer 110A, according to one or more embodiments. The interposer 110A includes a first set of contacts 260 for connecting circuit element in the interposer 110A to the first integrated circuit die 120A. Moreover, the interposer 110A includes a second set of contacts 270 for connecting circuit elements in the interposer 110A to the second integrated circuit die 125A. In some embodiments, the contacts in the first set of contacts 260 and second set of contacts 270 are contact pads.

Moreover, the interposer 110A includes a third set of contacts 280 for connecting circuit elements in the interposer 110A to an external circuit 290 (such as a package substrate). In some embodiments, the geometry (e.g., size and pitch) of the third set of contacts 280 is larger than the geometry of the first set of contacts 260 and the second set of contacts 270. Moreover, the first set of contacts 260 and second set of contacts 270 are arranged on a first side of the interposer 110A (e.g., top side), and the third set of contacts are arranged on a second side of the interposer 110A opposite to the first side (e.g., bottom side).

The interposer 110A additionally includes a set of interconnects 265. In some embodiments, a first subset of interconnects is configured to connect one or more contacts of the first set of contacts 260 corresponding to the first integrated circuit die 120A to one or more contacts of the second set of contacts 270 corresponding to the second integrated circuit die 120A. These interconnects enable the first integrated circuit die 120A to send or receive signals from the second integrated circuit die 125A, and allow the second integrated circuit die 125B to send or receive signals from the first integrated circuit die 120A.

Moreover, a second subset of interconnects is configured to connect one or more contacts of the first set of contacts 260 corresponding to the first integrated circuit die 120A to one or more contacts of the third set of contacts 280, and a third subset of interconnects is configured to connect one or more contacts of the second set of contacts 270 corresponding to the second integrated circuit die 125A to one or more contacts of the third set of contacts 280. The second subset of interconnects enables the first integrated circuit 120A to send or receive signals from the external source 290. The third subset of interconnects enables the second integrated circuit 125A to send or receive signals from the external source 290.

In some embodiments, the interposer includes a set of through-silicon vias (TSV) 285. The TSVs 285 are configured to connect each contact of the third set of contacts 280 to a metal interconnect 265.

Figure 3A:
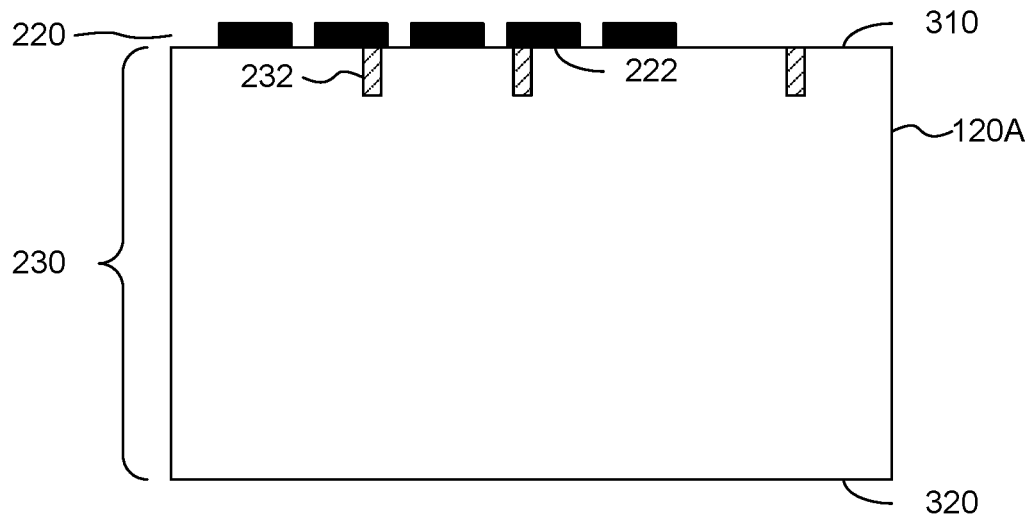
FIGS. 3A-3E illustrate cross sectional views of various fabrication steps of the first integrated circuit die, according to one or more embodiments.
Figure 3B:
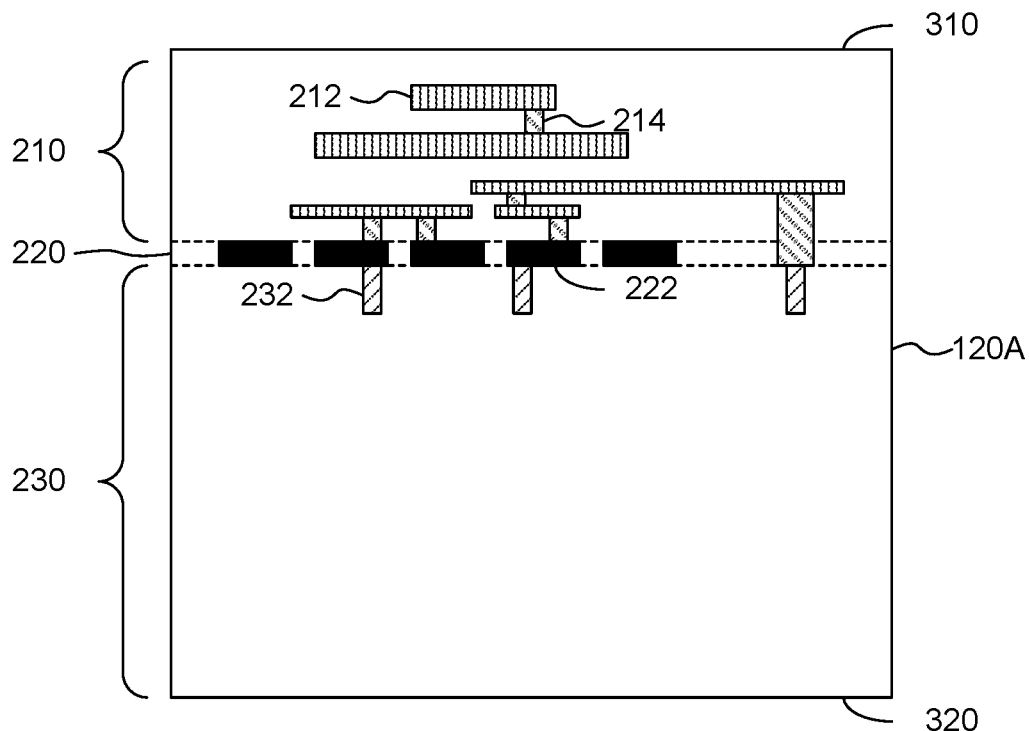

FIGS. 3A-3E illustrate cross sectional views of various fabrication steps of the first integrated circuit die 120A, according to one or more embodiments. As shown in FIG. 3A, the transistors 222 are formed on the top surface 310 of the substrate 230. Additionally, the BPR 232 are formed in the substrate 230. After the transistors 220 and the BPR 232 are formed, the front-side interconnects are formed, resulting in the structure shown in FIG. 3B.

Figure 3C:
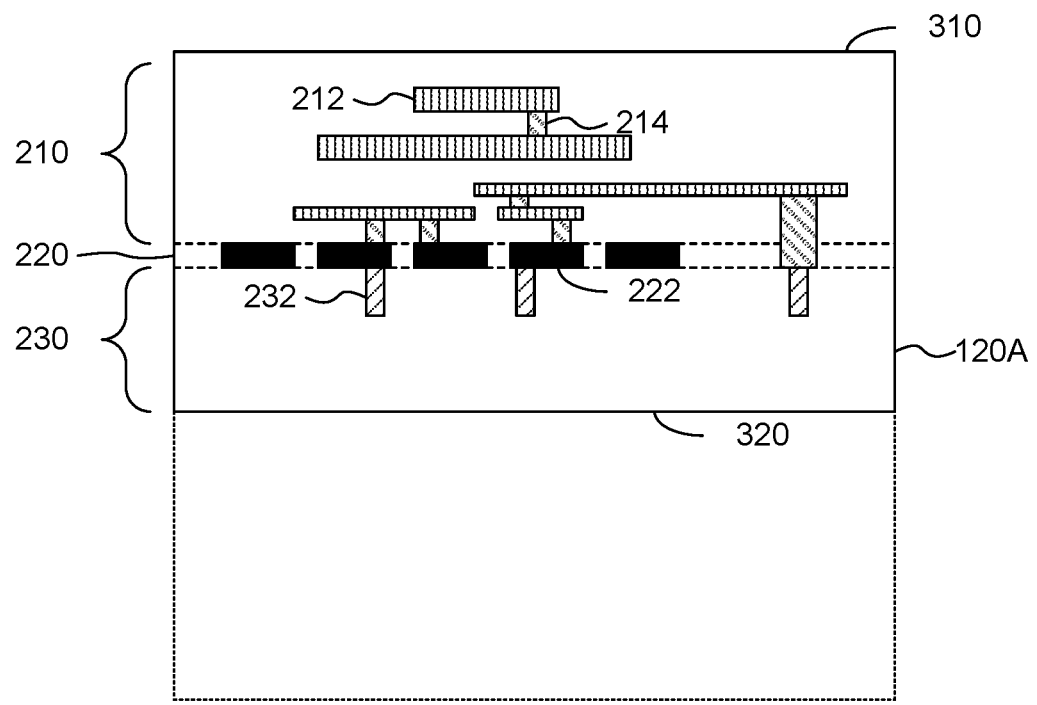

Once the front-side processing is completed, the substrate is thinned down resulting in the structure shown in FIG. 3C. In some embodiments, the substrate is thinned down using a chemical-mechanical polishing (CMP) process. Alternatively, other processes such as dry etching or wet etching are used.

Figure 3D:
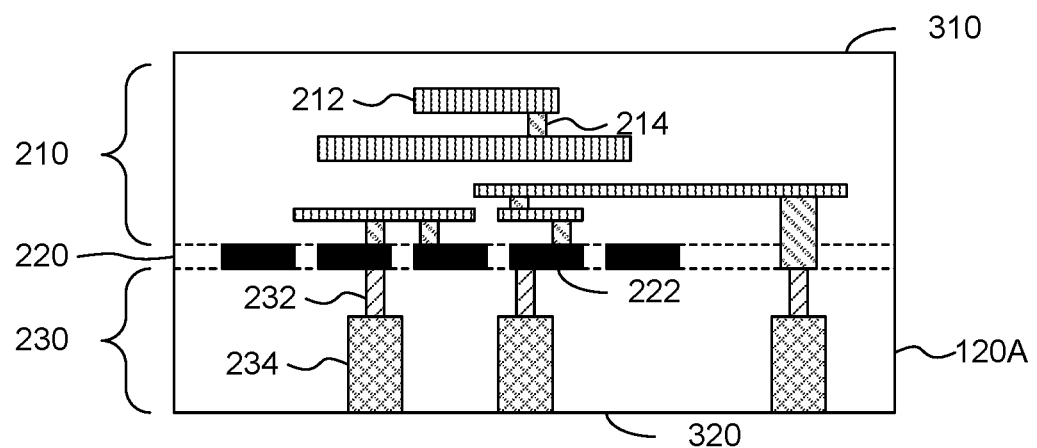

After the substrate has been thinned down to a set thickness, the TSVs 234 are formed, resulting in the structure shown in FIG. 3D. In some embodiments, the TSVs 234 are formed from the bottom surface 320 of the thinned down substrate. For example, the TSV 234 are formed by etching the substrate, until portions of the BPRs 232 are exposed, to form openings in the substrate, and depositing a metal to fill the openings.

Figure 3E:
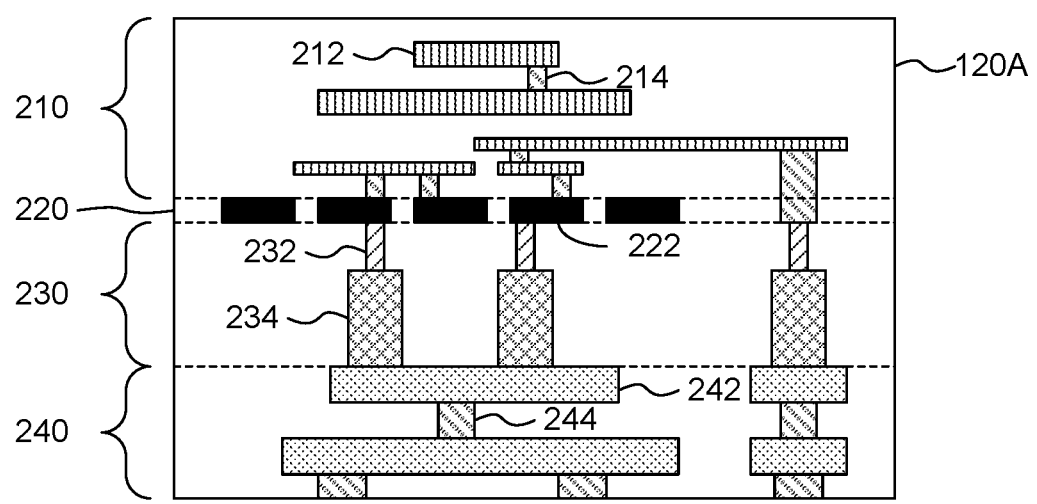

Finally, the back-side interconnects are formed, resulting in the structure shown in FIG. 3E. As described above, the back-side interconnects may be formed by depositing metal layers and insulating layers on the back side of the substrate, and patterning the metal layers and the insulating layers.

2.5D or 3D IC Architecture Having an Interposer Power Deliver Network

Figure 4A:
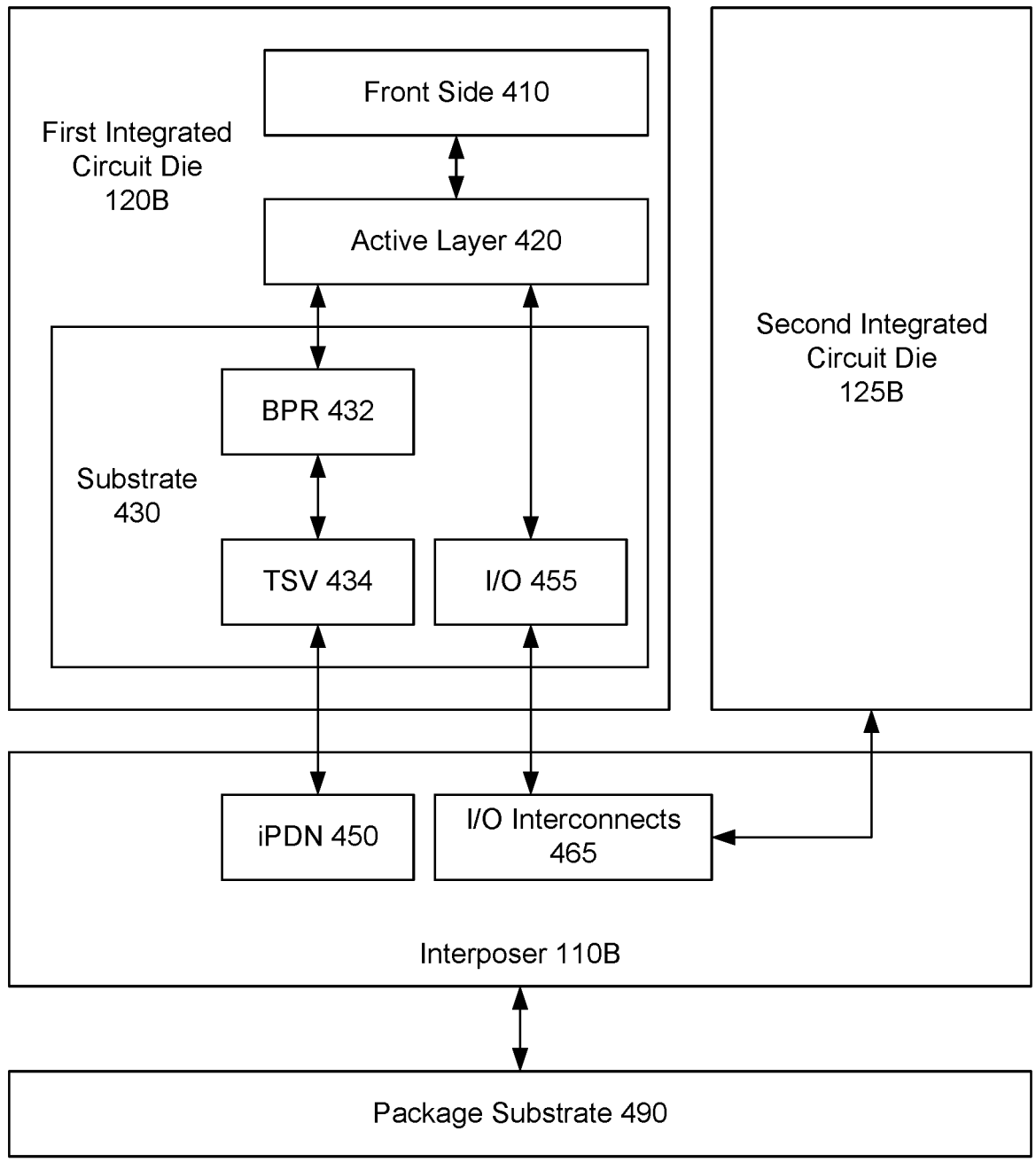
FIG. 4A is a block diagram illustrating an interposer architecture having multiple integrated circuit dice aligned to an interposer having an interposer power delivery network (iPDN), according to one or more embodiments.
Figure 4B:
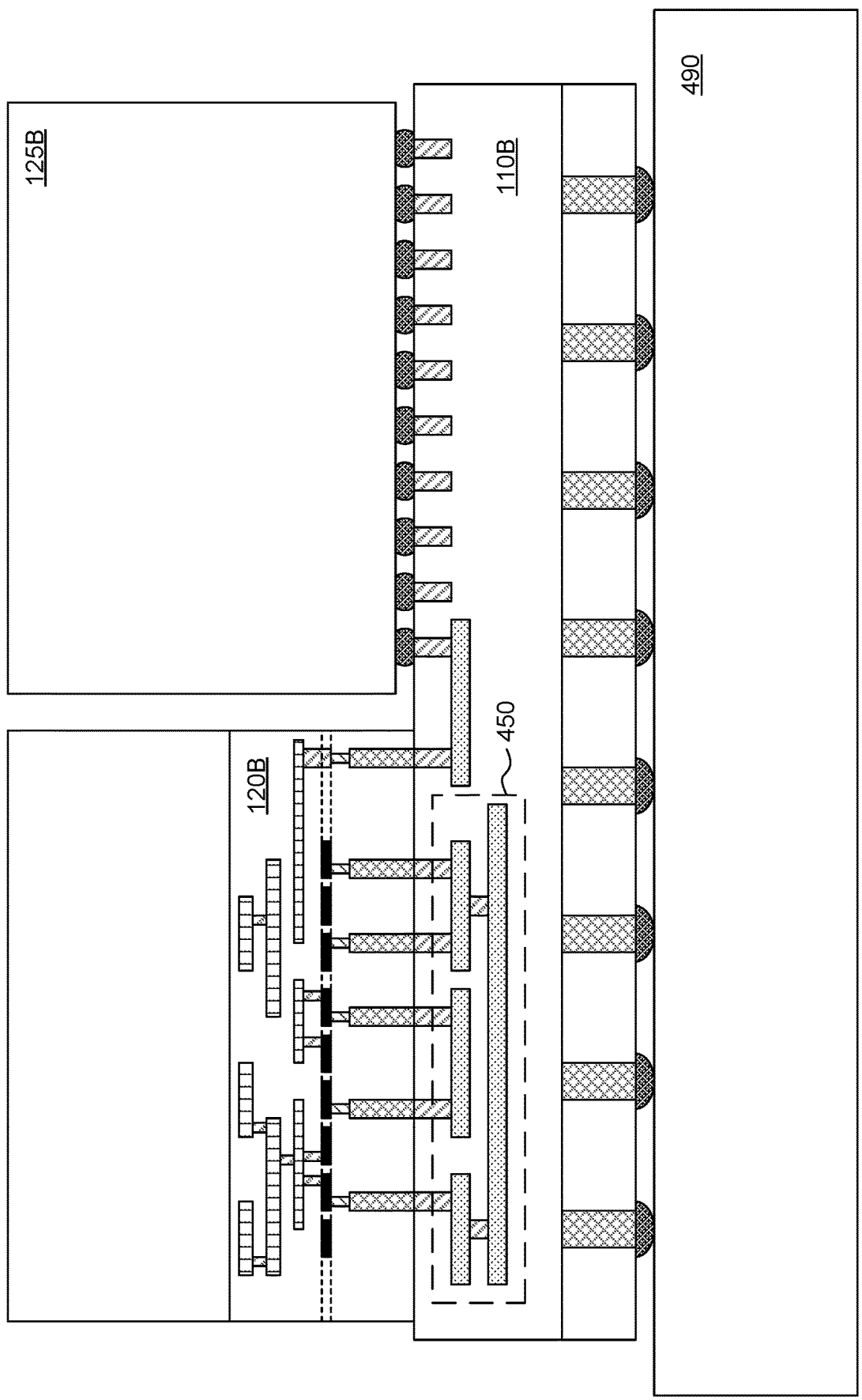
FIG. 4B illustrates a cross sectional view of multiple integrated circuit dice (e.g., a first integrated circuit die and a second integrated circuit die) aligned to an interposer having an iPDN, according to one or more embodiments.

FIG. 4A is a block diagram illustrating an interposer architecture having multiple integrated circuit dice 120 aligned to an interposer 110B having an interposer power delivery network (iPDN) 450, according to one or more embodiments. FIG. 4B illustrates a cross sectional view of multiple integrated circuit dice (e.g., a first integrated circuit die 120B and a second integrated circuit die 125B) aligned to an interposer 110B having an iPDN 450, according to one or more embodiments.

The first integrated circuit die 120B includes contacts that are aligned to contacts of interposer 110B. Similarly, the second integrated circuit die 125B includes contacts that are aligned to contacts of interposer 110B. In the example of FIG. 4B, the first integrated circuit die 120B is then bonded to the interposer 110B and the second integrated circuit die 125B is connected to the interposer 110B through micro solder balls. In some embodiments, the bonding process for bonding the first integrated circuit die 120B to the interposer 110B includes a thermal process that bonds the metal contacts of the first integrated circuit die 120B to the metal contacts of the interposer 110B. For instance, the first integrated circuit die 120B and the interposer 110B may be exposed to temperatures that are sufficient to cause interdiffusion of metal, or melt or partially melt the metal contacts. When the first integrated circuit 120B and the interposer 110B are cooled down, the metal contacts are fused together forming a permanent connection between them.

In some embodiments, the face of the first integrated circuit die 120B is bonded to the face of the interposer 110B. That is, bottom surface of the first integrated circuit die 120B is bonded to the top surface of the interposer 110B. For example, the first integrated circuit die 120B is bonded to the interposer 110B using a thermal process that causes an oxide or nitride layer on the bottom surface of the first integrated circuit die 120B to fuse to an oxide or nitride layer on the top surface of the interposer 110B. In some embodiments, a die-to-wafer bonding process is used to bond the first integrated circuit die 120B to the interposer 110B.

FIG. 4C illustrates a cross sectional view of the first integrated circuit die 120B configured to be connected to an interposer having an iPDN 450 across a first direction, according to one or more embodiments. FIG. 4D illustrates a cross sectional view of the first integrated circuit die 120B configured to be connected to an interposer having an iPDN 450 across a second direction, according to one or more embodiments. The first integrated circuit die 120B includes active layer 420 where a set of active components 422 are implemented, front side 410 over the active layer 420 where a set of interconnects are formed, and substrate 430 having a set of BPRs 432 and a set of TSVs 434. Each TSV 434 has two ends. A first end of each TSV is connected to a BPR 432 and a second end of each TSV 434 is connected to a contact at the bottom surface 420 of the first integrated circuit 120B to allow the TSVs 434 to be connected to a power delivery network implemented in the interposer 110. In some embodiments, the contact for connecting a TSV 434 to the interposer 110B is an exposed surface of the TSV 434.

In some embodiments, the substrate 430 additionally includes I/O nodes 455. Each I/O node 455 includes a buried conductor 452 and a TSV 454. The buried conductors 452 may be formed together with the BPR 432. Similarly, the TSV 454 may be formed together with the TSV 434. In some embodiments, the I/O nodes 455 are formed around the periphery of the first integrated circuit die 120B. In other embodiments, the I/O nodes 455 are throughout the bottom surface 420 of the first integrated circuit die 120B.

Unlike the integrated circuit die 120A of FIGS. 2B-2D, the integrated circuit die 120B of FIGS. 4B-4D does not have a back-side power delivery network. As such, the fabrication of the integrated circuit die 120B is simplified, reducing the cost of manufacturing the integrated circuit die 120B and increasing the yield of the manufacturing process.

Figure 4E:
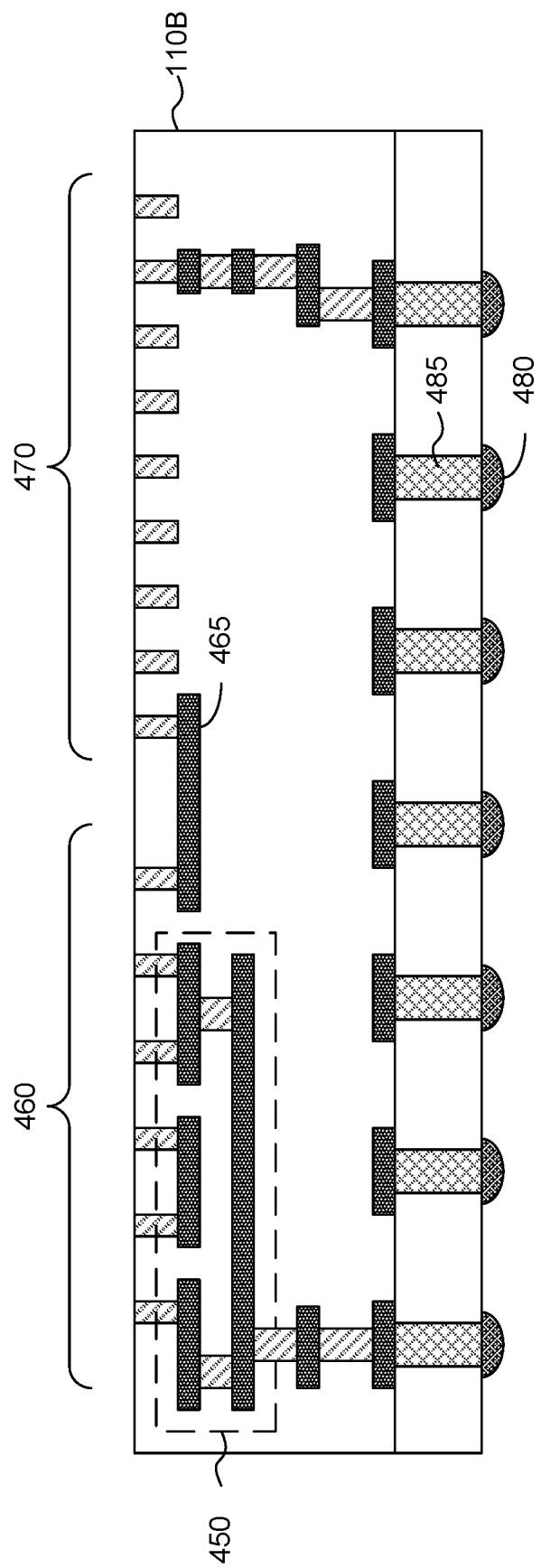
FIG. 4E illustrates a cross sectional view of the interposer having an iPDN, according to one or more embodiments.

FIG. 4E illustrates a cross sectional view of the interposer 110B having an iPDN 450, according to one or more embodiments. The interposer 110B includes a first set of contacts 460 for connecting circuit element in the interposer 110B to the first integrated circuit die 120B, a second set of contacts 470 for connecting circuit elements in the interposer 110B to the second integrated circuit die 125B, and a third set of contacts 480 for connecting circuit elements in the interposer 110B to an external circuit 490 (such as a package substrate). In some embodiments, the geometry (e.g., size) and pitch of the third set of contacts 480 is larger than the geometry and pitch of the first set of contacts 460 and the second set of contacts 470. Moreover, the first set of contacts 460 and second set of contacts 470 are arranged on a first side of the interposer 110B (e.g., top side), and the third set of contacts are arranged on a second side of the interposer 110B opposite to the first side (e.g., bottom side).

The interposer 110B further includes an interposer power delivery network (iPDN) 450 and a set of I/O interconnects 465. At least a first subset of contacts of the first set of contacts 460 is coupled to the iPDN and at least a second subset of contacts of the first set of contacts 460 is coupled to the I/O interconnects 465.

The iPDN is configured to route power supply voltages to first subset of contacts of the first set of contacts 460. The iPDN is configured to be coupled to the TSVs 434 of the first integrated circuit die 120B to provide one or more power supply voltages (e.g., Vdd, Vss, and ground) to the TSVs 434. The iPDN 450 may also be configured to connect multiple TSVs 434 to each other to enable the TSVs 434 to provide a supply voltage to multiple points in a BPR 432 to reduce the effect of a voltage drop across the BPR 432 due to a resistance of the conductor used for fabricating the BPR 432.

The iPDN 450 includes a set of interconnects for connecting one TSV 434 of the first integrated circuit die 120B to other TSVs 434 of the first integrated circuit die 120B, and to connect the TSVs 434 to a power supply voltage (e.g., provided by the package substrate 490). In some embodiments, the iPDN 450 includes a first set of interconnects for providing a first supply voltage (e.g., Vdd) to a first set of TSVs 434, and a second set of interconnects for providing a second supply voltage (e.g., Vss or ground) to a second set of TSVs 434.

The I/O interconnects 465 are configured to connect a contact of the first set of contacts 460 corresponding to the first integrated circuit die 120B to a contact of the second set of contacts 470 corresponding to the second integrated circuit die 125B. Thus, the I/O interconnects 465 route signals between the first integrated circuit die 120B and the second integrated circuit die 125B. In some embodiments, the I/O interconnects 465 additionally connect one or more contacts of the second set of contacts 470 corresponding to the second integrated circuit die 125B to a contact of the third set of contacts 480. The I/O interconnects, thus, allow signals to be routed between the second integrated circuit die 120B and the substrate package 490.

In some embodiments, the interposer 110B is fabricated using a larger technology node than the first integrated circuit 120B. As such, the iPDN 450 may be made more reliably and using a cheaper process than the back-side power delivery network 250 of the first integrated circuit die of FIGS. 2B-2D.

Figure 5:
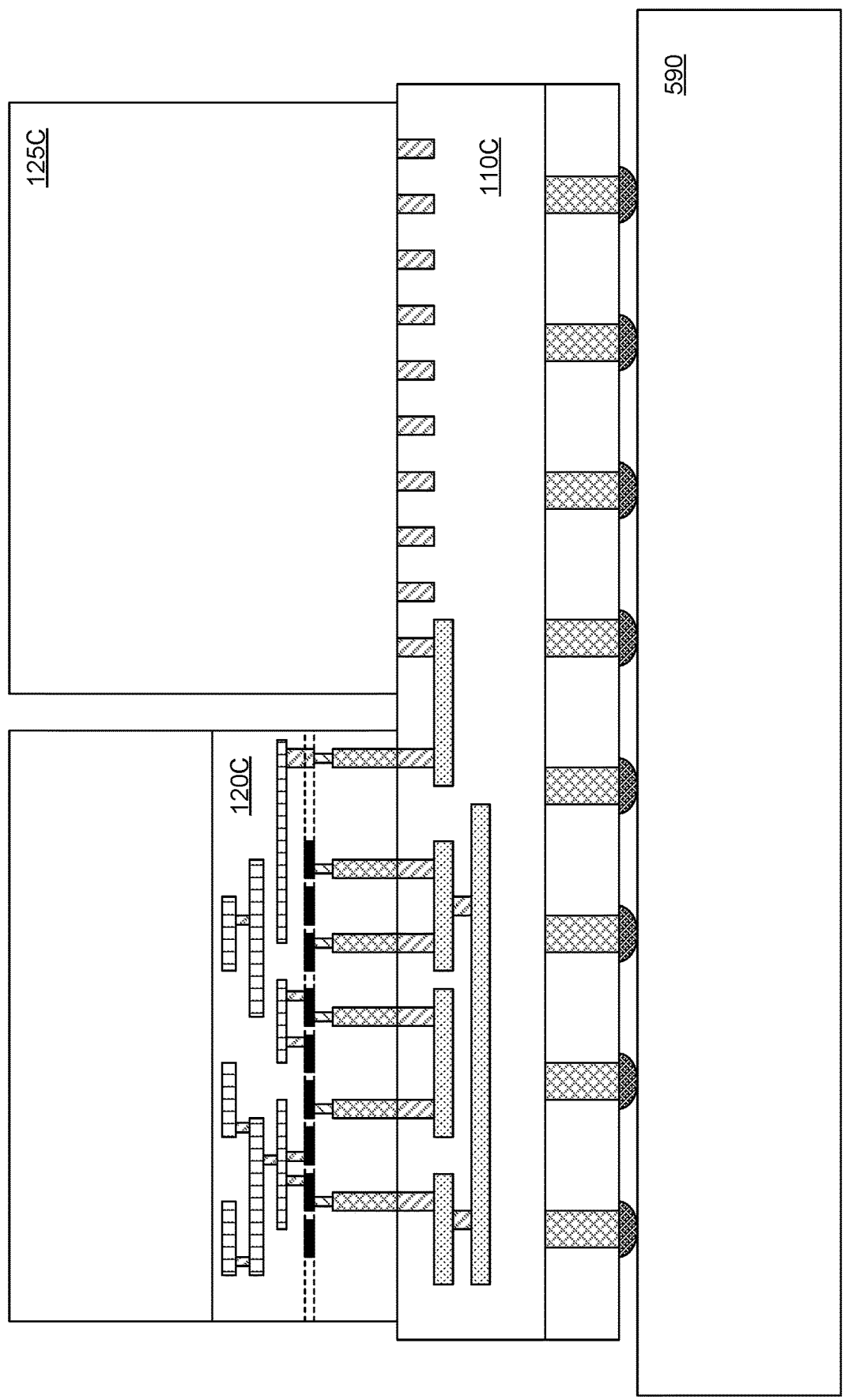
FIG. 5 illustrates a cross sectional view of multiple integrated circuit dice bonded to an interposer, according to one or more embodiments

FIG. 5 illustrates a cross sectional view of multiple integrated circuit dice (e.g., a first integrated circuit die 120C and a second integrated circuit die 125C) aligned to an interposer 110C having an iPDN 450, according to one or more embodiments. In the embodiment of FIG. 5, both the first integrated circuit die 120C and the second integrated circuit die 125C are bonded to the interposer 110C using face-to-face bonding. In some embodiments, the first integrated circuit die 120C and the second integrated circuit die 125C are bonded to the interposer 110C using die-to-wafer bonding, so that no micro solder bumps are used for connecting the interposer 110C to the first integrated circuit die 120C and the second integrated circuit die 125C, resulting in smaller resistance and capacitance and improving performance and power of the package.

Additional Configuration Consideration

As used herein any reference to "one embodiment" or "an embodiment" means that a particular element, feature, structure, or characteristic' described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the disclosure. This description should be read to include one or at least one and the singular also includes the plural unless it is obvious that it is meant otherwise.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. An electronic circuit comprising:
    an integrated circuit die comprising a first substrate, the first substrate supporting:
        a first set of contacts,
        a buried power rail (BPR) disposed within the first substrate, the BPR configured to provide a supply voltage to a plurality of transistors of the integrated circuit die,
        a plurality of through-silicon vias (TSV), each TSV of the plurality of TSVs having a first end coupled to the BPR, and a second end coupled to a contact of the first set of contacts, the plurality of TSVs configured to provide the supply voltage to multiple locations within the BPR; and
    an interposer comprising a second substrate, the second substrate supporting:
        a second set of contacts, each contact of the second set of contacts corresponding to a contact of the first set of contacts, and
        a power delivery network (PDN), the PDN coupled to the second set of contacts, the PDN for routing the power supply voltage to the second set of contacts to provide the power supply to each of the TSVs of the integrated circuit die.

2. The electronic circuit of claim 1, wherein the integrated circuit die is bonded to the interposer.

3. The electronic circuit of claim 2, wherein a bottom surface of the integrated circuit die is bonded to a top surface of the interposer.

4. The electronic circuit of claim 1, wherein the integrated circuit die is fabricated using a first fabrication process node and wherein the interposer is fabricated using a second fabrication process node, larger than the first fabrication process node.

5. The electronic circuit of claim 1, wherein the BPR is fabricated by etching the first substrate to form an opening in the first substrate, and depositing a conductive material to fill the opening.

6. The electronic circuit of claim 1, wherein the BPR is disposed within an isolation region of the integrated circuit die, the isolation region for separating two or more transistors implementing an integrated circuit.

7. The electronic circuit of claim 6, wherein the isolation region is a shallow trench isolation (STI) region.

8. The electronic circuit of claim 6, wherein the BPR is coupled to at least one of the two or more transistors implementing the integrated circuit.

9. The electronic circuit of claim 1, wherein the interposer further comprises:
    a third set of contacts configured to be connected to an external system, wherein the PDN is further coupled to the third set of contacts.

10. The electronic circuit of claim 9, wherein the second set of contacts are disposed on a first surface of the interposer, and wherein the third set of contacts are disposed on a second surface of the interposer opposite to the first surface.

11. The electronic circuit of claim 1, wherein the PDN comprises a plurality of interconnects for connecting the second set of contacts to each other.

12. The electronic circuit of claim 1, wherein the plurality of TSVs are periodically disposed along a length of the BPR.

13. The electronic circuit of claim 1, wherein the plurality of TSVs are fabricated by:
    thinning down the first substrate,
    etching regions of a bottom surface of the integrated circuit die to form a plurality of openings, wherein the regions of the bottom surface of the integrated circuit die are etched until the BPR is exposed, and
    filling the plurality of openings with a conductive material.

* * * * *